(12) United States Patent
Chuang et al.

(10) Patent No.: US 11,289,366 B1
(45) Date of Patent: Mar. 29, 2022

(54) METHOD OF MANUFACTURING SEMICONDUCTOR STRUCTURE

(71) Applicant: NANYA TECHNOLOGY CORPORATION, New Taipei (TW)

(72) Inventors: Ying-Cheng Chuang, Taoyuan (TW); Tzu-Li Tseng, New Taipei (TW); Tsung-Cheng Chen, Yilan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/089,681

(22) Filed: Nov. 4, 2020

(51) Int. Cl.
*H01L 21/00* (2006.01)
*H01L 21/768* (2006.01)
*H01L 21/308* (2006.01)
*H01L 21/033* (2006.01)
*H01L 21/02* (2006.01)

(52) U.S. Cl.
CPC .. *H01L 21/76801* (2013.01); *H01L 21/02304* (2013.01); *H01L 21/033* (2013.01); *H01L 21/0332* (2013.01); *H01L 21/0337* (2013.01); *H01L 21/0338* (2013.01); *H01L 21/308* (2013.01); *H01L 21/3081* (2013.01); *H01L 21/3086* (2013.01); *H01L 21/3088* (2013.01)

(58) Field of Classification Search
None
See application file for complete search history.

(56) References Cited

U.S. PATENT DOCUMENTS

2019/0035677 A1* 1/2019 Chandhok ......... H01L 21/76865
2021/0125836 A1* 4/2021 Huang ................ H01L 21/3085

* cited by examiner

*Primary Examiner* — Reema Patel
(74) *Attorney, Agent, or Firm* — CKC & Partners Co., LLC

(57) ABSTRACT

A method of manufacturing a semiconductor structure includes the following operations. A buffer layer is formed over a substrate. A first top hard mask is formed on the buffer layer, in which the first top hard mask has a first trench to expose a first portion of the buffer layer. A spacer layer is formed to cover a sidewall of the first trench and an upper surface of the first top hard mask and the first portion of the buffer layer to form a second trench over the first portion. The top portion and the bottom portion are etched to form a thinned top portion and a thinned bottom portion. A second top hard mask is formed in the second trench. The thinned top portion and the vertical portion of the spacer layer are removed.

9 Claims, 13 Drawing Sheets

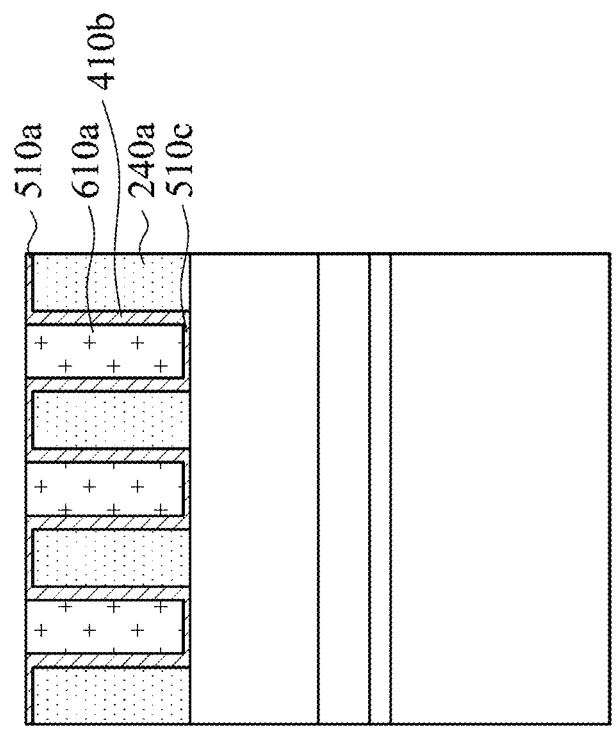
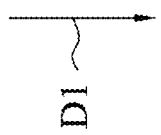
Fig. 7

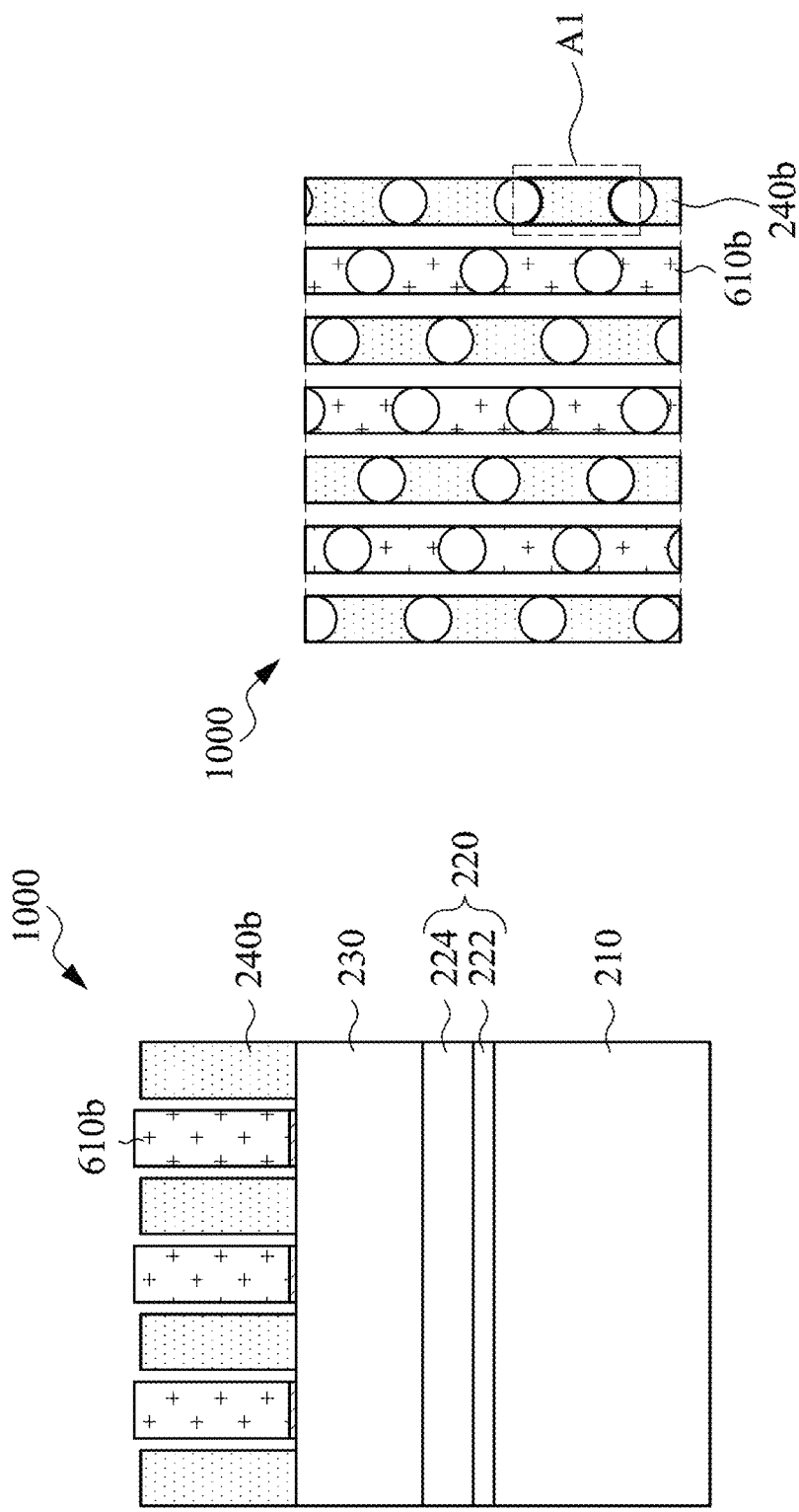

METHOD OF MANUFACTURING SEMICONDUCTOR STRUCTURE

BACKGROUND

Field of Invention

The present disclosure relates to a method of manufacturing a semiconductor structure.

Description of Related Art

Accompanying with the development of semiconductor technologies, the density of an integrated circuit (IC) has become greater, and the efficiency of an integrated circuit has become faster. An isolation structure of a semiconductor device is formed between active areas (AAs) to electrically insulate active areas. With the density of the integrated circuit increases, the pitch of the active areas and the size of the isolation structure also decrease.

However, there are several problems that existed in manufacturing the active areas. For example, it is difficult to control the critical dimensions (CDs) of the active areas, and it may lead to critical dimension imbalance. Another problem is that the short circuits may occur between the active areas, and it may lead to leakage current. The above problems would decrease the quality of semiconductor devices, thereby decreasing the yield of semiconductor devices.

In view of the descriptions above, there is a need for a novel manufacturing method to overcome the problems mentioned above.

SUMMARY

One aspect of the present disclosure is to provide a method of manufacturing a semiconductor structure. The method includes the following operations. A buffer layer is formed over a substrate. A first top hard mask is formed on the buffer layer, in which the first top hard mask has a first trench to expose a first portion of the buffer layer. A spacer layer is formed to cover a sidewall of the first trench and an upper surface of the first top hard mask and the first portion of the buffer layer to form a second trench over the first portion, in which the spacer layer includes a top portion disposed on the upper surface of the first top hard mask, a vertical portion disposed on the sidewall of the first trench, and a bottom portion disposed on the first portion of the buffer layer. The top portion and the bottom portion are etched to form a thinned top portion and a thinned bottom portion. A second top hard mask is formed in the second trench. The thinned top portion and the vertical portion of the spacer layer are removed. The first top hard mask and the second top hard mask are etched to form a patterned top hard mask. The substrate and the buffer layer according to the patterned top hard mask are etched to form a third trench in the substrate.

According to some embodiments of the present disclosure, the method further includes forming a bottom hard mask on the substrate before forming the buffer layer over the substrate.

According to some embodiments of the present disclosure, the bottom hard mask includes an oxide layer and a nitride layer, the nitride layer is disposed on the substrate, and the oxide layer is disposed on the nitride layer.

According to some embodiments of the present disclosure, an aspect ratio of the first trench is between 1.5 and 6.

According to some embodiments of the present disclosure, the top portion and the bottom portion are etched to form the thinned top portion and the thinned bottom portion by performing a dry etching process.

According to some embodiments of the present disclosure, each of a thickness of the thinned top portion and the thinned bottom portion of the spacer layer is between 1 nm and 5 nm.

According to some embodiments of the present disclosure, a thickness of the vertical portion of the spacer layer is between 8 nm and 20 nm.

According to some embodiments of the present disclosure, the thinned top portion and the vertical portion of the spacer layer are removed by performing a dry etching process.

According to some embodiments of the present disclosure, a material of the first top hard mask is the same as a material of the second top hard mask, and a material of the spacer layer is different from those of the first top hard mask and the second top hard mask.

According to some embodiments of the present disclosure, the first top hard mask and the second top hard mask are made of silicon oxide, and the spacer layer is made of silicon nitride.

According to some embodiments of the present disclosure, the first top hard mask and the second top hard mask are made of silicon nitride, and the spacer layer is made of silicon oxide.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 4-8A, 9A, 10A, and 11 are cross-sectional views schematically illustrating intermediate stages in a method of manufacturing a semiconductor structure in accordance with some embodiments of the present disclosure.

FIGS. 3C, 9B, and 10B are top views of masks of a method of manufacturing a semiconductor structure in accordance with some embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A manufacturing method of active areas of a semiconductor structure involves several processes, and it may cause the problems mentioned previously. Specifically, critical dimensions of active areas would affect the quality of the semiconductor structure. The critical dimension of an active area is the width of the active area; however, the critical dimensions of adjacent active areas may be different, which can be called as critical dimension imbalance, thereby leading to a negative impact on the semiconductor structure. Furthermore, short circuits between active areas would also affect the quality of the semiconductor structure. In detail, adjacent active areas may not be completely separated, so that the current may pass through the undesired path and causes leakage current. The present disclosure provides a method of manufacturing the semiconductor structure, in which critical dimensions of adjacent active areas in the semiconductor structure are substantially the same, and there are no short circuits between active areas. Embodiments of the method of manufacturing the semiconductor structure will be described in detail below.

Figure 1:
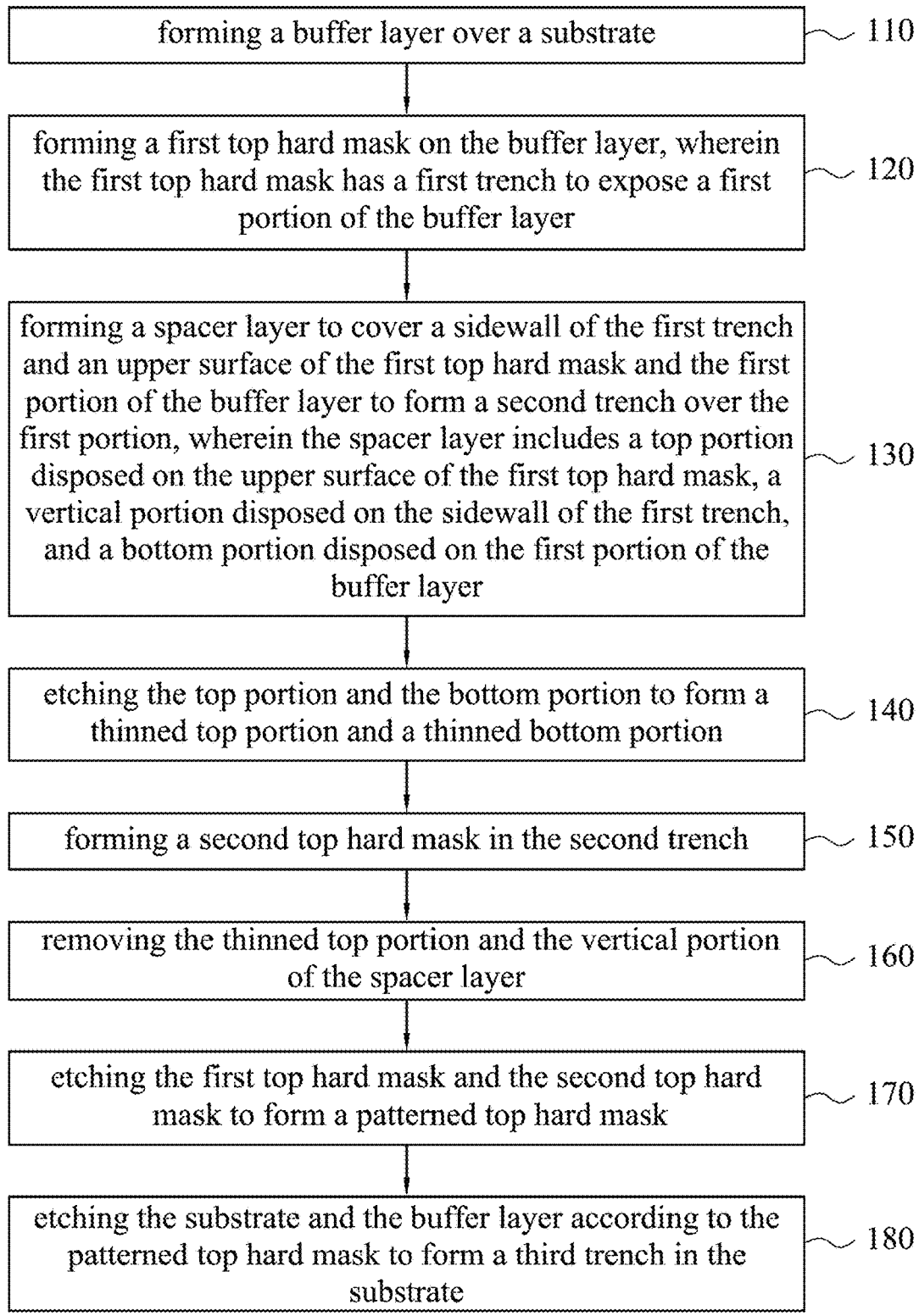
FIG. 1 is a flowchart of a method of manufacturing a semiconductor structure in accordance with some embodiments of the present disclosure.

FIG. 1 is a flowchart of a method 100 of manufacturing a semiconductor structure in accordance with some embodiments of the present disclosure. Operation 110, a buffer layer is formed over a substrate. The method continues with operation 120 in which a first top hard mask is formed on the buffer layer, in which the first top hard mask has a first trench to expose a first portion of the buffer layer. Operation 130, a spacer layer is formed to cover a sidewall of the first trench and an upper surface of the first top hard mask and the first portion of the buffer layer to form a second trench over the first portion, in which the spacer layer includes a top portion disposed on the upper surface of the first top hard mask, a vertical portion disposed on the sidewall of the first trench, and a bottom portion disposed on the first portion of the buffer layer. The method continues with operation 140 in which the top portion and the bottom portion are etched to form a thinned top portion and a thinned bottom portion. Operation 150, a second top hard mask is formed in the second trench. The method continues with operation 160 in which the thinned top portion and the vertical portion of the spacer layer are removed. Operation 170, the first top hard mask and the second top hard mask are etched to form a patterned top hard mask, followed by operation 180 in which the substrate and the buffer layer are etched according to the patterned top hard mask to form a third trench in the substrate. It is understood that FIG. 1 has been simplified for a good understanding of the concepts of the present disclosure. Accordingly, it should be noted that additional processes may be provided before, during, and after the method of FIG. 1, and that some other processes may only be briefly described herein.

FIG. 2, FIG. 3A, FIG. 4, FIG. 5, FIG. 6, FIG. 7, FIG. 8A, FIG. 9A, FIG. 10A and FIG. 11 are cross-sectional views schematically illustrating intermediate stages in a method of manufacturing a semiconductor structure in accordance with some embodiments of the present disclosure. FIG. 3C, FIG. 9B and FIG. 10B are top views of masks of a method of manufacturing a semiconductor structure in accordance with some embodiments of the present disclosure.

Figure 2:
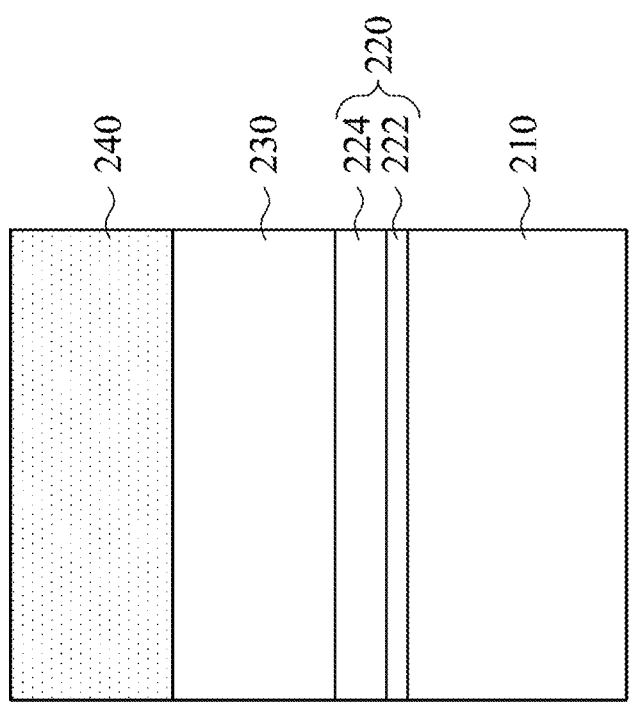

Please refer to FIG. 2, a substrate 210 is provided, and a bottom hard mask 220, a buffer layer 230 and a first top hard mask 240 are formed on the substrate 210. In some embodiments, the bottom hard mask 220, the buffer layer 230 and the first top hard mask 240 can be formed by deposition processes, such as plasma-enhanced atomic layer deposition (PEALD), physical vapor deposition (PVD), low-pressure chemical vapor deposition (LPCVD), atmospheric-pressure chemical vapor deposition (APCVD), plasma-enhanced chemical vapor deposition (PECVD), or other suitable deposition processes.

In some embodiments, the substrate 210 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof.

Still referring to FIG. 2, the bottom hard mask 220 is formed on the substrate 210. In some embodiments, the bottom hard mask 220 may be silicon nitride, silicon oxide, silicon oxynitride, silicon carbide, or some other suitable hard mask material. In some embodiments, the bottom hard mask 220 may include one or more layers. For example, as shown in FIG. 2, the bottom hard mask 220 includes a first bottom hard mask 222 and a second bottom hard mask 224 over the first bottom hard mask 222, which may be made of different materials. In some embodiments, the first bottom hard mask 222 is made of silicon oxide and may be called as a pad oxide layer, and the second bottom hard mask 224 is made of silicon nitride and may be called as a pad nitride layer. In some embodiments, a thickness of the first bottom hard mask 222 is less than that of the second bottom hard mask 224, but not limited thereto.

As shown in FIG. 2, the buffer layer 230 is formed over the substrate 210 (the operation 110 of FIG. 1). In some embodiments, the buffer layer 230 may include silicon, carbon, or some other suitable hard mask material. In some embodiments, the buffer layer 230 may include one or more layers. For example, the buffer layer 230 may include a first buffer layer (not shown) disposed on the bottom hard mask 220, and a second buffer layer (not shown) disposed on the first buffer layer, in which a material of the first buffer layer is different from that of the second buffer layer. In some embodiments, the material of the first buffer layer is carbon, and the material of the second buffer layer is silicon. In some embodiments, a material of the buffer layer 230 is different from that of the bottom hard mask 220.

As shown in FIG. 2, the first top hard mask 240 is formed over the substrate 210. In some embodiments, the first top hard mask 240 may be made by silicon oxide or silicon nitride.

Figure 3B:
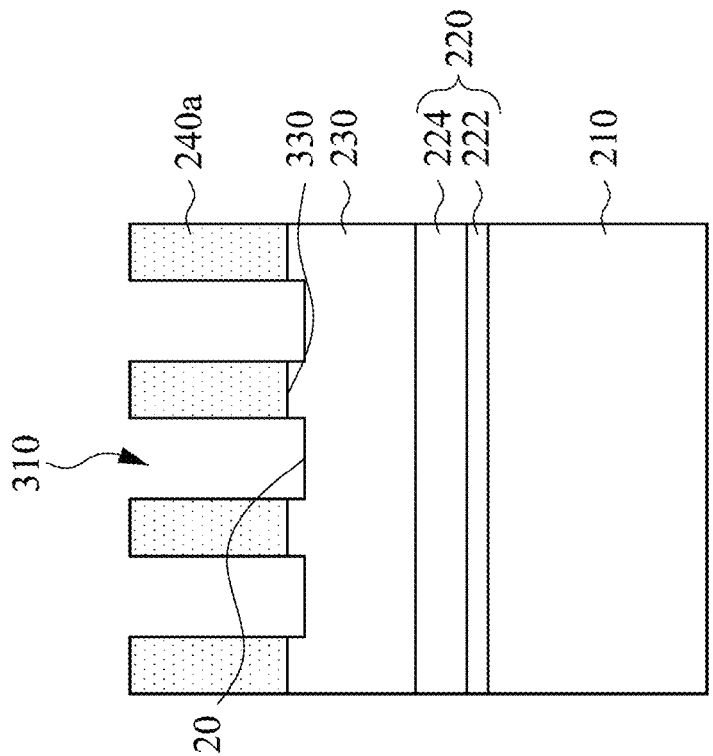
FIGS. 3B and 8B are cross-sectional views schematically illustrating intermediate stages in a method of manufacturing a semiconductor structure in accordance with alternative embodiments of the present disclosure.
Figure 3A:
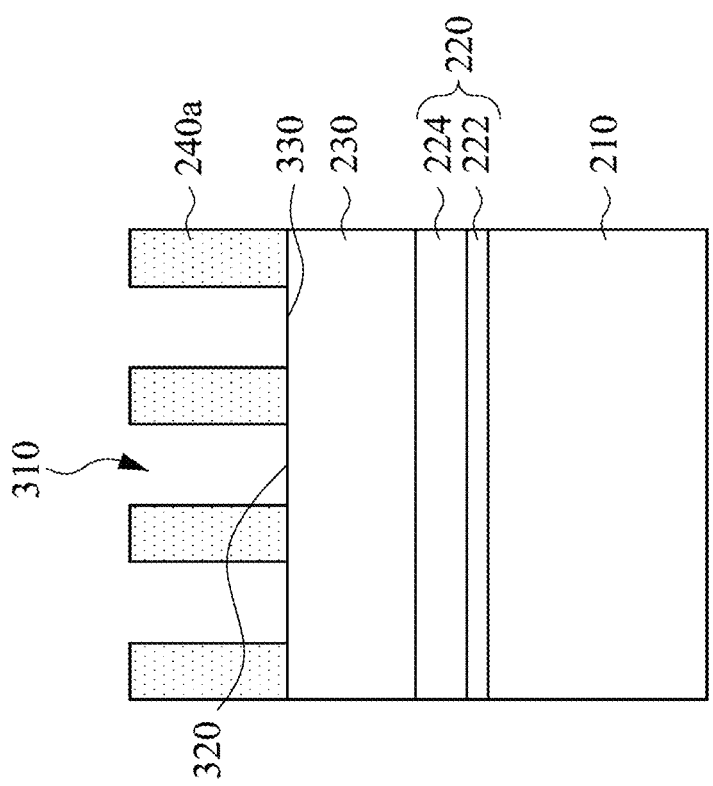
Figure 3C:
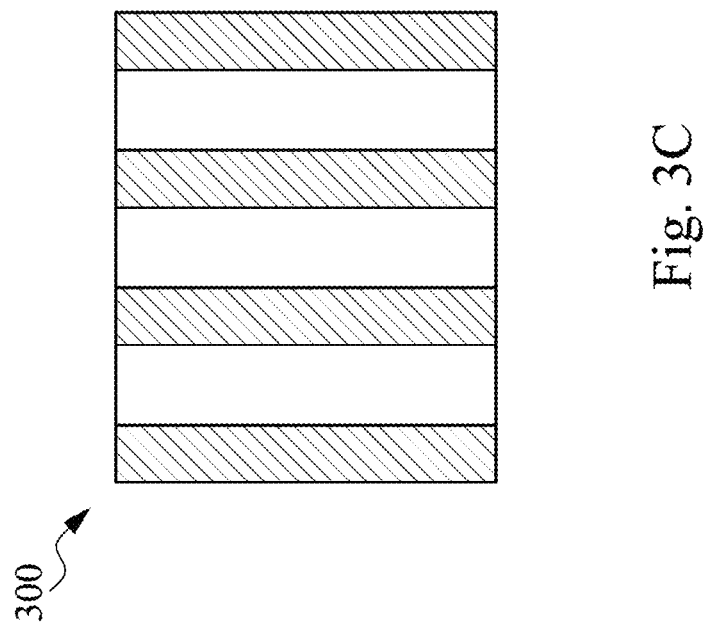

Please refer to FIG. 2, FIG. 3A and FIG. 3C simultaneously. In some embodiments, a portion of the first top hard mask 240 shown in FIG. 2 is removed according to a mask 300 shown in FIG. 3C to form a first top hard mask 240a shown in FIG. 3A, so that the first top hard mask 240a has a first trench 310 to expose a first portion of the buffer layer 230 (the operation 120 of FIG. 1). As shown in FIG. 3C, the mask 300 is a strip-shaped mask. In detail, the mask 300 in FIG. 3C only illustrates 4 columns, so that the first top hard mask 240a has 4 columns. It should be understood that the number of columns of the mask 300 and the first top hard mask 240a is merely simplified illustrated, and it is not intended to limit the present disclosure. In some embodiments, a top surface 320 of the first portion of the buffer layer 230 is substantially aligned with a bottom surface 330 of the first top hard mask 240a, as shown in FIG. 3A. In alternative embodiments, the top surface 320 of the first portion of the buffer layer 230 is not aligned with the bottom surface 330 of the first top hard mask 240a, as shown in FIG. 3B. More specifically, from FIG. 2 to FIG. 3B, a portion of the buffer layer 230 is also etched during the process of removing the portion of the first top hard mask 240. In some embodiments, an aspect ratio of the first trench 310 is between 1.5 and 6, for example, 2, 2.5, 3, 3.5, 4, 4.5, 5, or 5.5.

Figure 4:
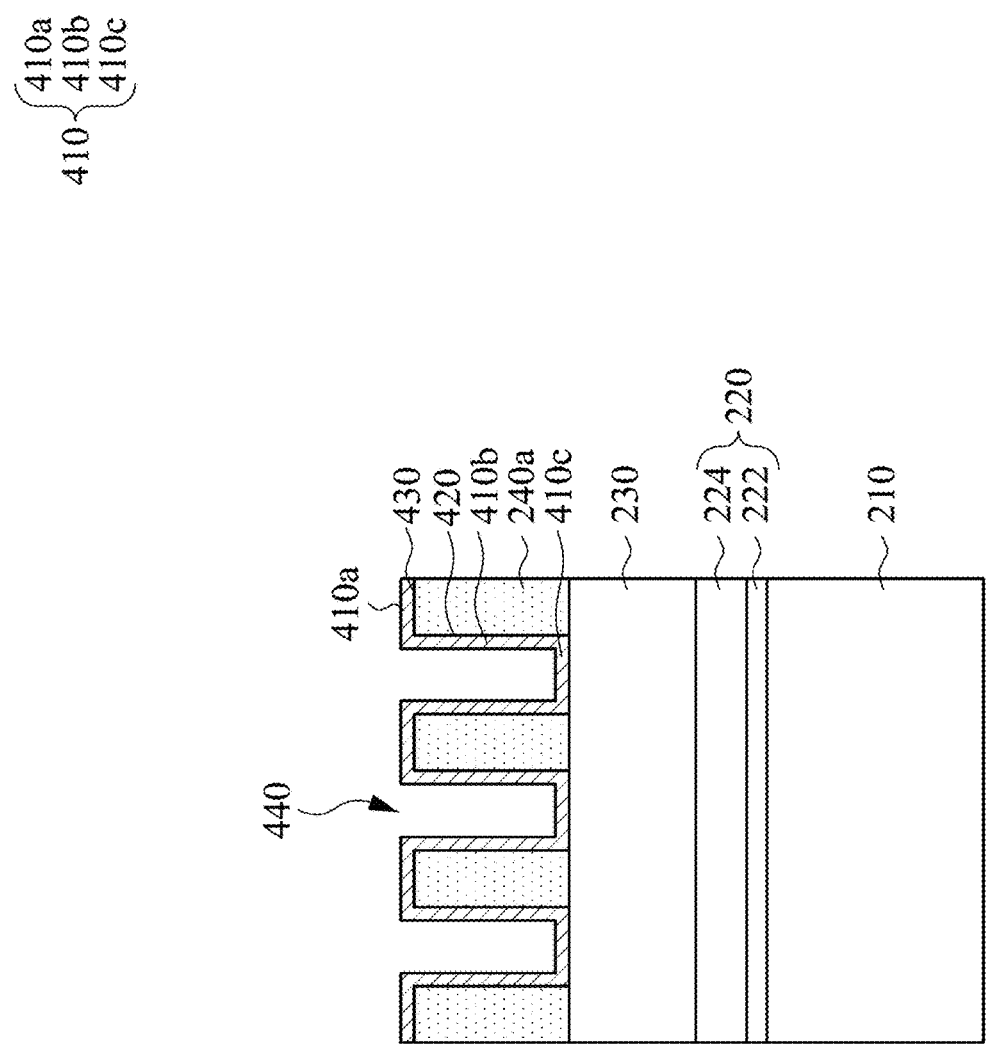

Please refer to FIG. 3A and FIG. 4. In some embodiments, a spacer layer 410 is formed to cover a sidewall 420 of the first trench 310 and an upper surface 430 of the first top hard mask 240a and the first portion of the buffer layer 230 to form a second trench 440 over the first portion, in which the spacer layer 410 includes a top portion 410a disposed on the upper surface 430 of the first top hard mask 240a, a vertical portion 410b disposed on the sidewall 420 of the first trench 310, and a bottom portion 410c disposed on the first portion of the buffer layer 230 (the operation 130 of FIG. 1). In some embodiments, the spacer layer 410 can be formed by a deposition process, such as PEALD, PVD, LPCVD, APCVD, PECVD, or other suitable deposition processes. In some embodiments, the spacer layer 410 may be made of silicon oxide or silicon nitride. In some embodiments, the spacer layer 410 is silicon nitride when the first top hard mask 240a is silicon oxide. In some embodiments, the spacer layer 410 is silicon oxide when the first top hard mask 240a is silicon nitride.

Figure 5:
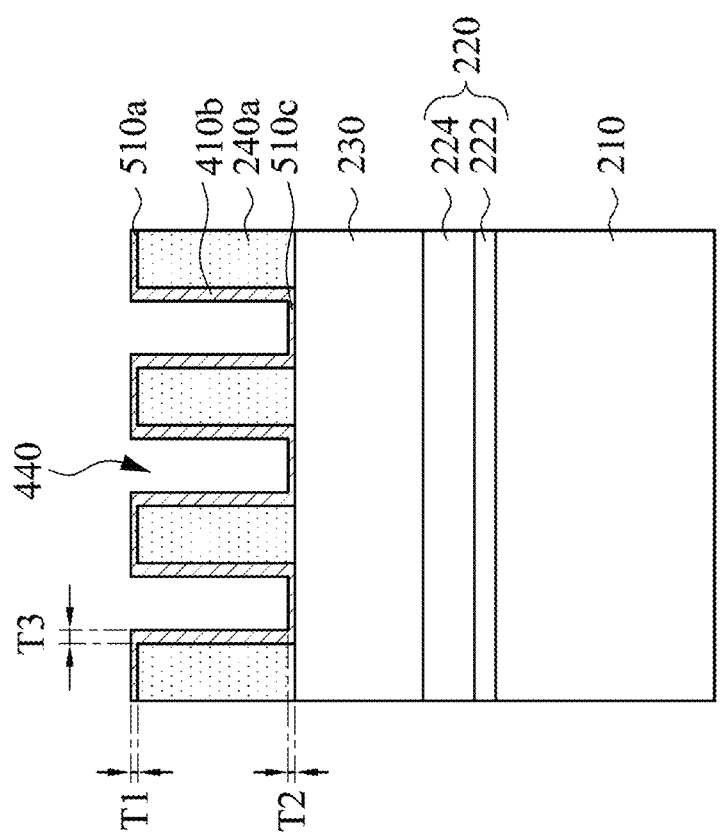

Please refer to FIG. 4 and FIG. 5. In some embodiments, the top portion 410a and the bottom portion 410c are etched to form a thinned top portion 510a and a thinned bottom portion 510c (the operation 140 of FIG. 1). In some embodiments, the top portion 410a and the bottom portion 410c are etched by performing a dry etching process, such as a reactive ion etching (RIE) process, but not limited thereto. In some embodiments, the etching gas may include $CF_4$, $NF_3$, $SF_6$, He, other suitable gases or a combination thereof. In some embodiments, the time-mode control is used in the dry etching process so that the thicknesses of the thinned top portion 510a and the thinned bottom portion 510c can be controlled.

As shown in FIG. 5, the thinned top portion 510a has a thickness T1, the thinned bottom portion 510c has a thickness T2, and the vertical portion 410b has a thickness T3 after performing the etching process as mentioned above. In some embodiments, the thickness T1 of the thinned top portion 510a and the thickness T2 of the thinned bottom portion 510c are between 1 nm and 5 nm, for example, 2, 3, or 4 nm. When the thickness T1 of the thinned top portion 510a is between 1 nm and 5 nm, an appropriate signal of the thinned top portion 510a can be detected by the end point detection (EPD) in the subsequent etching process. If the thickness T1 of the thinned top portion 510a is greater than 5 nm, it may cause critical dimension imbalance between the active areas in the subsequent etching process, and this is because the signal of the thinned top portion 510a may be too large. If the thickness T1 of the thinned top portion 510a is smaller than 1 nm, it may cause short circuits between the active areas in the subsequent etching process, and this is because the signal of the thinned top portion 510a may be too small. The detail of the subsequent etching process related to the thickness T1 will be discussed below. In some embodiments, the thickness T3 of the vertical portion 410b is between 8 nm to 20 nm, for example, 10, 12, 14, 16, or 18 nm.

Figure 6:
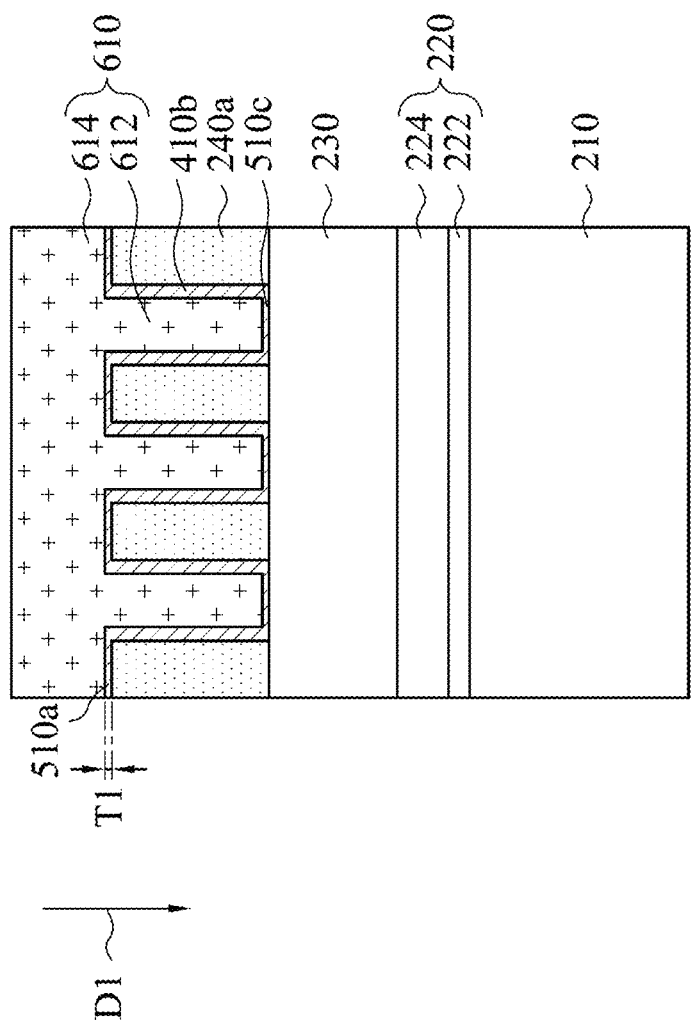

Please refer to FIG. 5 and FIG. 6. In some embodiments, a second top hard mask 610 is formed in the second trench 440 (the operation 150 of FIG. 1). Specifically, a lower portion 612 of the second top hard mask 610 fills into the second trench 440, and an upper portion 614 of the second top hard mask 610 is disposed on the lower portion 612 and the thinned top portion 510a of the spacer layer 410. In some embodiments, the second top hard mask 610 can be formed by a deposition process, such as PEALD, PVD, LPCVD, APCVD, PECVD, or other suitable deposition processes. In some embodiments, the second top hard mask 610 may be made by silicon oxide or silicon nitride. In some embodiments, a material of the first top hard mask 240 (or 240a) is the same as a material of the second top hard mask 610, and a material of the spacer layer 410 is different from those of the first top hard mask 240 (or 240a) and the second top hard mask 610. In some embodiments, the first top hard mask 240 (or 240a) and the second top hard mask 610 are made of silicon oxide, and the spacer layer 410 is made of silicon nitride. In some embodiments, the first top hard mask 240 (or 240a) and the second top hard mask 610 are made of silicon nitride, and the spacer layer 410 is made of silicon oxide.

In some embodiments, an underlayer coating (not shown) is disposed over the second top hard mask layer 610 after forming the second top hard mask 610 in the second trench 440. The deposition process may be the same as that of mentioned above. The underlayer coating may be made by silicon-rich material or hard mask material mentioned above.

Please refer to FIG. 6 and FIG. 7. In some embodiments, the upper portion 614 of the second top hard mask layer 610 is removed to form a second top hard mask layer 610a. In some embodiments, the upper portion 614 is removed by performing a dry etching process, such as a reactive ion etching (RIE) process, or a blanket etching process, but not limited thereto. In some embodiments, the etching gas may include $CF_4$, $NF_3$, $SF_6$, He, other suitable gases or a combination thereof.

Figure 8B:
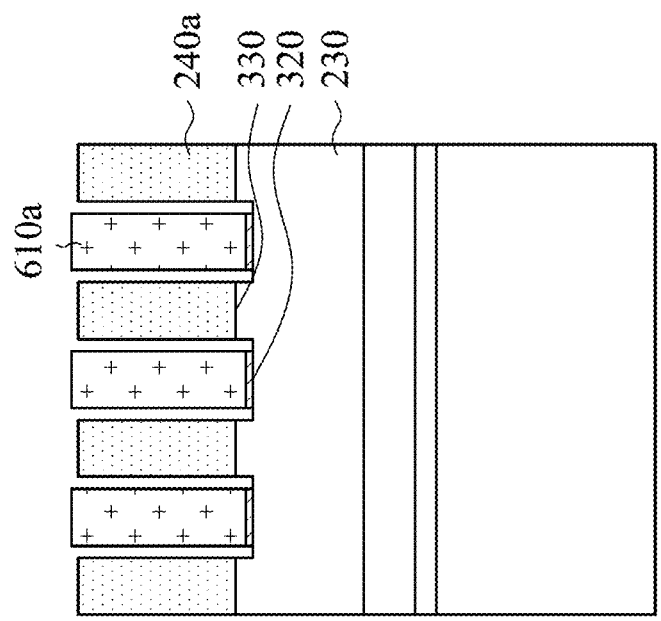
Figure 8A:
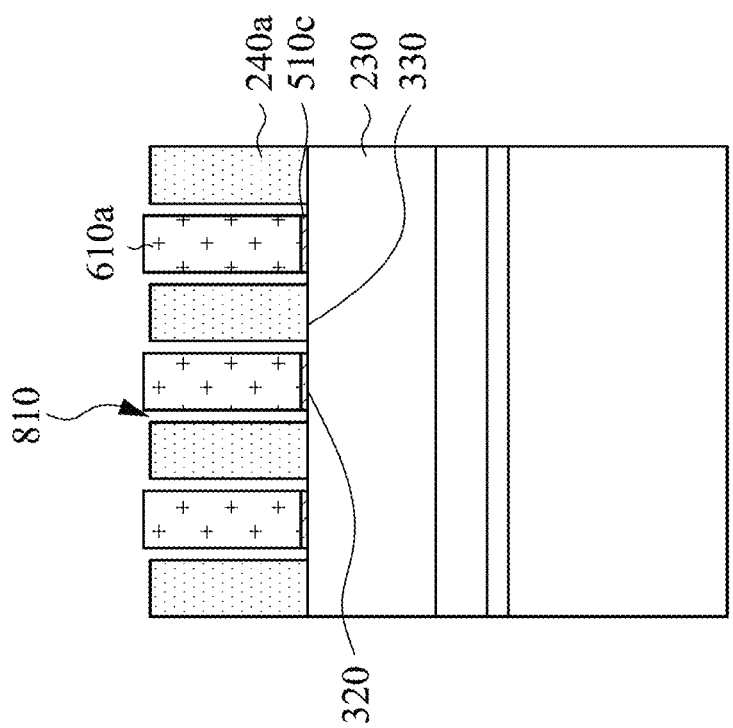
Figure 9B:
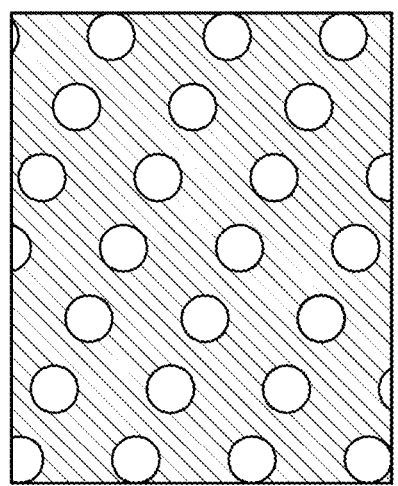

Please refer to FIG. 7 and FIG. 8A. In some embodiments, the thinned top portion 510a and the vertical portion 410b of the spacer layer 410 are removed (the operation 160 of FIG. 1) to form a hole 810, so as to the first top hard mask 240a and the second top hard mask 610a are staggered and individual to each other. In other words, the thinned bottom portion 510c of the spacer layer 410 is remained between the second top hard mask 610a and the buffer layer 230. In detail, the second top hard mask 610a has 3 portions in FIG. 8A, and it should be understood that the number of portions of the second top hard mask 610a is merely simplified illustrated, and it is not intended to limit the present disclosure. In some embodiments, the thinned top portion 510a and the vertical portion 410b are removed by a dry etching process, such as a reactive ion etching (RIE) process, but not limited thereto. In some embodiments, the etching gas may include $CF_4$, $NF_3$, $SF_6$, He, other suitable gases or a combination thereof.

It is to be understood that the etching process from FIG. 6 to FIG. 8A at least includes a two-step etching process, and the end point detection (EPD) is used during the etching process. Specifically, according to a direction D1 in FIG. 6 and FIG. 7, the first-step etching is to remove the upper portion 614 of the second top hard mask layer 610 to expose the thinned top portion 510a of the spacer layer 410, and the second-step etching is to remove the thinned top portion 510a and the vertical portion 410b of the spacer layer 410. More specifically, during the two-step etching process, the material of the second top hard mask layer 610 would be detected in the first-step etching, and subsequently the material of the thinned top portion 510a of the spacer layer 410 would be detected in the second-step etching, in which the etching gases used in the first-step etching and the second-step etching are different because the etching objects are different. It should be noticed that the thickness T1 of the thinned top portion 510a of the spacer layer 410 is between 1 nm and 5 nm, which provides the appropriate signal of the end point detection; therefore, it can avoid critical dimension imbalance and short circuits between the active areas.

FIG. 8B is a cross-sectional view schematically illustrating an intermediate stage of a method of manufacturing a semiconductor structure in accordance with alternative embodiments of the present disclosure. In detail, FIG. 8B is obtained by the manufacturing process of the present disclosure from FIG. 3A, 4-7 to 8A as mentioned above. The only difference between FIG. 8A and FIG. 8B is that the top surface 320 of the first portion of the buffer layer 230 is not aligned with the bottom surface 330 of the first top hard mask 240a, and other features in FIG. 8B are the same as those in FIG. 8A.

Figure 9A:
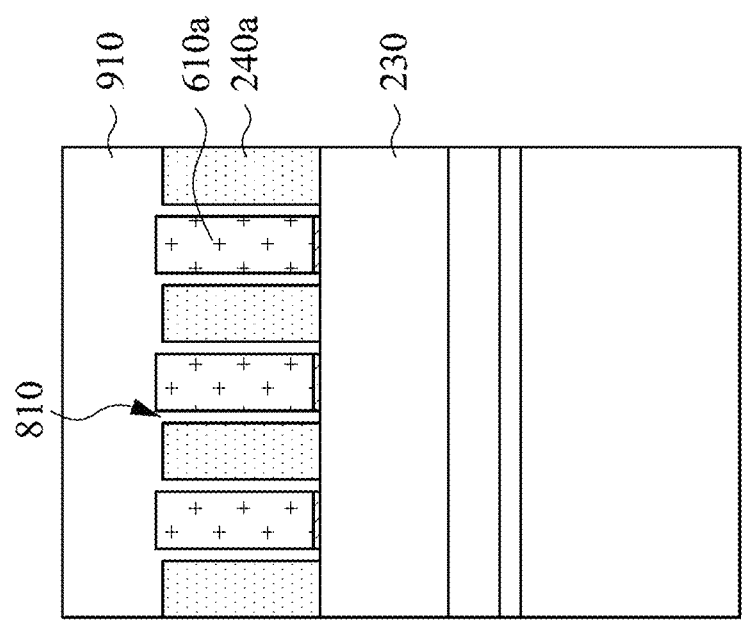

Please refer to FIG. 8A, FIG. 9A and FIG. 9B. FIG. 9B is a top view of a mask of a method of manufacturing a semiconductor structure in accordance with some embodiments of the present disclosure. In some embodiments, a photoresist layer 910 is disposed on the first top hard mask 240a and the second top hard mask 610a, and fills the hole 810. In some embodiments, a photolithography process is performed according to the pattern in the mask 920. The pattern in the mask 920 has multiple holes which are orderly arranged, as shown in FIG. 9B, and each hole column of the mask 920 is aligned with each portion of the first top hard mask 240a and the second first top hard mask 610a. Specifically, the mask 920 has 7 hole columns, as shown in FIG. 9B, and each hole column of the mask 920 is aligned with 4 portions of the first top hard mask 240a and 3 portions of the second first top hard mask 610a.

Please refer to FIG. 9A, FIG. 10A and FIG. 10B. FIG. 10B is a top view of FIG. 10A, and FIG. 10B is a top view of a mask of a method of manufacturing a semiconductor structure in accordance with some embodiments of the present disclosure. In some embodiments, the first top hard mask 240a and the second top hard mask 610a shown in FIG. 9A are etched to form a patterned top hard mask 1000 shown in FIGS. 10A and 10B (the operation 170 of FIG. 1).

In detail, a portion of the first top hard mask 240a and a portion of the second top hard mask 610a are removed according to the mask 920 to form a first top hard mask 240b and a second top hard mask 610b after a photolithography process is performed, as shown in FIG. 10A. Therefore, the first top hard mask 240b and the second top hard mask 610b form the patterned top hard mask 1000, as shown in FIG. 10B. Specifically, the patterned top hard mask 1000 in FIG. 10B includes multiple holes which are orderly arranged in the first top hard mask 240b and the second top hard mask 610b. Please refer to an area A1 in FIG. 10B, the shape shown in the area A1 is the top view of each of the first top hard mask 240b and the second top hard mask 610b. Specifically, the area A1 has four sharp corners after the photolithography process as mentioned above is performed.

Figure 11:
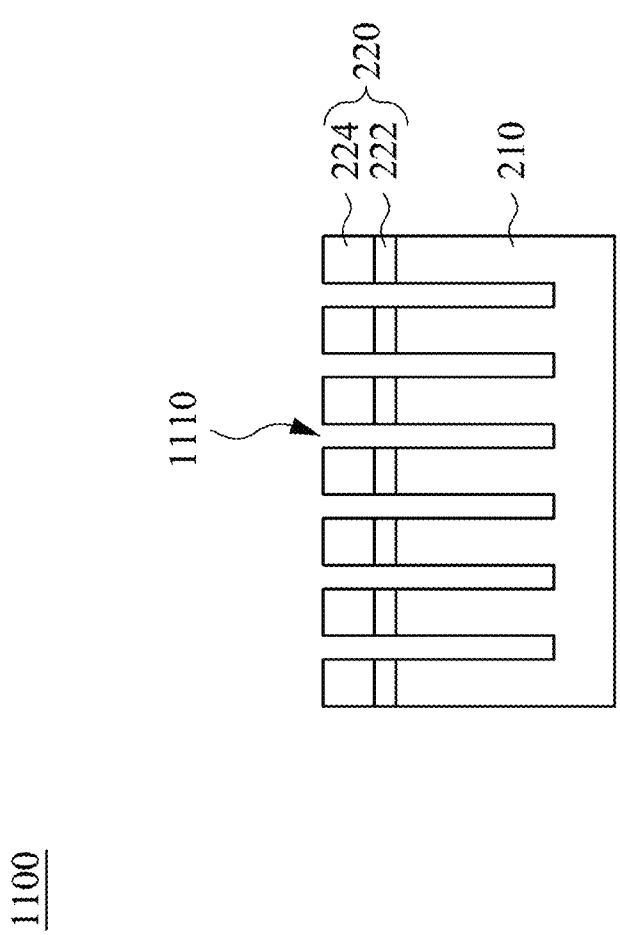

Please refer to FIG. 10A, FIG. 10B and FIG. 11. In some embodiments, the substrate 210 and the buffer layer 230 are etched according to the patterned top hard mask 1000 to form a third trench 1110 in the substrate 210 (the operation 180 of FIG. 1) by an etching process. In some embodiments, the bottom hard mask 220 is also etched by the etching process. In some embodiments, the etching process can be a dry etching process, such as a reactive ion etching (RIE) process, but not limited thereto. In detail, the semiconductor structure 1100 shown in FIG. 11 is the active areas.

Figure 12:
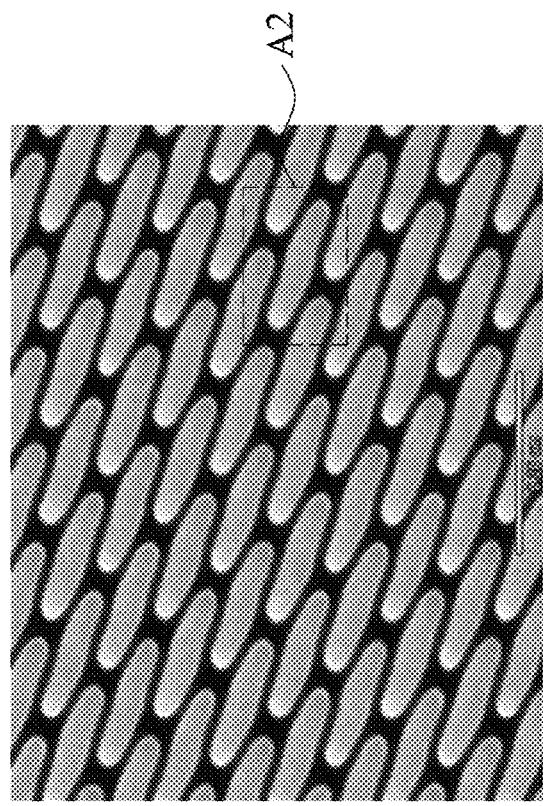
FIG. 12 is a SEM image of a semiconductor structure with some embodiments of the present disclosure.

FIG. 12 is a SEM image of a semiconductor structure with some embodiments of the present disclosure. FIG. 12 is a top view of FIG. 11. FIG. 12 shows a plurality of island-shaped active areas, in which there is no critical dimension imbalance or short circuits between the active areas. More specifically, the pitch between each island-shaped active area is substantially the same. The first top hard mask 240b and the second top hard mask 610b have the shape shown in area A1. It should be noticed that the each area A1 would be transferred into an elliptical shape shown in an active area A2 of FIG. 12. This is because the patterned top hard mask 1000 has been undergone multiple etching steps and so the shape shown in the area A1 would be gradually changed to an elliptical shape, when the material of the first top hard mask 240 (240a, or 240b) and the material of the second top hard mask 610 (610a, or 610b) is an amorphous material, for example, silicon oxide.

The present disclosure uses the operation of etching the top portion and the bottom portion to form a thinned top portion and a thinned bottom portion to provide an appropriate signal of the spacer layer when the thinned bottom portion of the spacer layer is in an appropriate thickness. When the thickness of the thinned top portion is between 1 nm and 5 nm, it can avoid critical dimension imbalance or short circuits between the active areas, thereby improving the quality of semiconductor devices.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising:

forming a bottom hard mask on a substrate, wherein the bottom hard mask comprises an oxide layer and a nitride layer, the nitride layer is disposed on the substrate, and the oxide layer is disposed on the nitride layer;

forming a buffer layer over the substrate after forming the bottom hard mask on the substrate;

forming a first top hard mask on the buffer layer, wherein the first top hard mask has a first trench to expose a first portion of the buffer layer;

forming a spacer layer to cover a sidewall of the first trench and an upper surface of the first top hard mask and the first portion of the buffer layer to form a second trench over the first portion, wherein the spacer layer comprises a top portion disposed on the upper surface of the first top hard mask, a vertical portion disposed on the sidewall of the first trench, and a bottom portion disposed on the first portion of the buffer layer;

etching the top portion and the bottom portion to form a thinned top portion and a thinned bottom portion;

forming a second top hard mask in the second trench;

removing the thinned top portion and the vertical portion of the spacer layer;

etching the first top hard mask and the second top hard mask to form a patterned top hard mask; and etching the substrate and the buffer layer according to the patterned top hard mask to form a third trench in the substrate.

2. The method of claim 1, wherein an aspect ratio of the first trench is between 1.5 and 6.

3. The method of claim 1, wherein etching the top portion and the bottom portion to form the thinned top portion and the thinned bottom portion is performed by a dry etching process.

4. The method of claim 1, wherein each of a thickness of the thinned top portion and the thinned bottom portion of the spacer layer is between 1 nm and 5 nm.

5. The method of claim 1, wherein a thickness of the vertical portion of the spacer layer is between 8 nm and 20 nm.

6. The method of claim 1, wherein removing the thinned top portion and the vertical portion of the spacer layer is performed by a dry etching process.

7. The method of claim 1, wherein a material of the first top hard mask is the same as a material of the second top hard mask, and a material of the spacer layer is different from those of the first top hard mask and the second top hard mask.

8. The method of claim 7, wherein the first top hard mask and the second top hard mask are made of silicon oxide, and the spacer layer is made of silicon nitride.

9. The method of claim 7, wherein the first top hard mask and the second top hard mask are made of silicon nitride, and the spacer layer is made of silicon oxide.

* * * * *